United States Patent
Suetsugu

(10) Patent No.: US 12,342,460 B2
(45) Date of Patent: Jun. 24, 2025

(54) FLEXIBLE CIRCUIT BOARD, ELECTRIC MOTOR, AND METHOD OF MANUFACTURING FLEXIBLE CIRCUIT BOARD

(71) Applicant: HONDA MOTOR CO., LTD., Tokyo (JP)

(72) Inventor: Daiki Suetsugu, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 217 days.

(21) Appl. No.: 18/343,238

(22) Filed: Jun. 28, 2023

(65) Prior Publication Data
US 2024/0049390 A1 Feb. 8, 2024

(30) Foreign Application Priority Data
Aug. 3, 2022 (JP) .................................. 2022-124307

(51) Int. Cl.
H05K 1/11 (2006.01)
H05K 1/02 (2006.01)
H05K 3/36 (2006.01)

(52) U.S. Cl.
CPC ............. *H05K 1/118* (2013.01); *H05K 1/028* (2013.01); *H05K 3/361* (2013.01)

(58) Field of Classification Search
CPC ......... H05K 1/118; H05K 1/028; H05K 3/361
USPC ........................................................ 174/254
See application file for complete search history.

(56) References Cited

U.S. PATENT DOCUMENTS

| | | | |
|---|---|---|---|
| 2007/0075819 A1 | 4/2007 | Okuzawa et al. | |
| 2016/0197066 A1* | 7/2016 | Uchida | H01L 21/31055 438/3 |
| 2021/0074609 A1* | 3/2021 | Ozawa | H01L 23/4951 |

FOREIGN PATENT DOCUMENTS

| | | |
|---|---|---|
| JP | S55-127852 A | 10/1980 |
| JP | 2004-014940 A | 1/2004 |
| JP | 2006-067756 A | 3/2006 |
| JP | 2007-103686 A | 4/2007 |

* cited by examiner

*Primary Examiner* — Andargie M Aychillhum
(74) *Attorney, Agent, or Firm* — Rankin, Hill & Clark LLP

(57) ABSTRACT

A flexible circuit board includes: wiring connecting portions: connecting ends of the adjacent first wirings and second wirings through an insulating sheet and thereby forming a first continuous wiring; and connecting ends of the adjacent third wirings and fourth wirings through the insulating sheet and thereby forming a second continuous wiring; an external terminal connected to a first continuous wiring first end that is one end of the first continuous wiring; and a reversal connection portion connecting a first continuous wiring second end with a second continuous wiring second end, the first continuous wiring second end being another end of the first continuous wiring, the second continuous wiring second end being an end of the second continuous wiring on a side of the first continuous wiring second end.

6 Claims, 4 Drawing Sheets

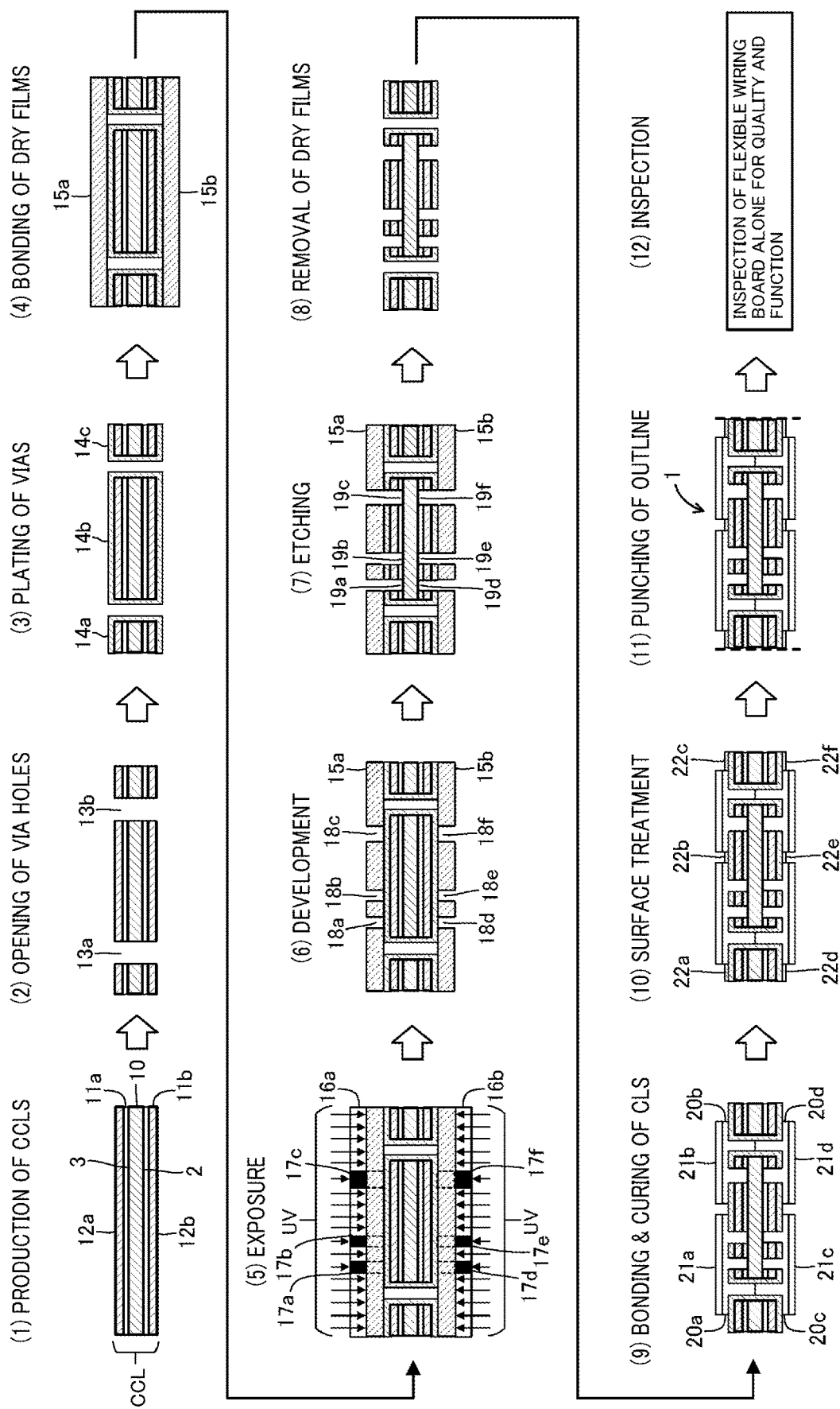

FLEXIBLE CIRCUIT BOARD, ELECTRIC MOTOR, AND METHOD OF MANUFACTURING FLEXIBLE CIRCUIT BOARD

INCORPORATION BY REFERENCE

The present application claims priority under 35 U.S.C. § 119 to Japanese Patent Application No. 2022-124307 filed on Aug. 3, 2022. The content of the application is incorporated herein by reference in its entirety.

BACKGROUND OF THE INVENTION

Field of the Invention

The present invention relates to a flexible circuit board, an electric motor, and a method of manufacturing a flexible circuit board.

Description of the Related Art

Conventionally, a technique has been known in which a motor stator is configured with a flexible circuit board (see, for example, Japanese Patent Laid-Open No. 2006-067756). Japanese Patent Laid-Open No. 2006-067756 discloses a method of manufacturing a stator configured by: forming a plurality of sheet coils each made by preparing a strip-shaped insulating film with a plurality of holes into which stator cores are to be inserted and by forming coils around the respective holes; layering and winding the sheet coils around a winding form; and electrically connecting the corresponding coils on the respective layered sheet coils to each other.

In addition, a configuration is known in which: an insulating sheet has bending portions set at equal intervals; the bending portions partition the sheet into unit pieces on which semi-arc-shaped conductive patterns are alternately formed; and the sheet can be used by separating at some of the bending portions depending on the number of windings (for example, see Japanese Patent Laid-Open No. 2004-014940).

In addition, a choke coil is known that has: a general outline in the form of a rectangular parallelepiped provided by forming an insulating layer, a first helical coil unit, a second helical coil unit, and a closed magnetic path, on a silicon substrate with thin film forming techniques; and the first and second helical coil units that are formed so that their axes of spiral extend substantially parallel to the substrate surfaces of the silicon substrates (see, for example, Japanese Patent Laid-Open No. 2007-103686).

In addition, there is known a coreless motor including an armature that is made by: forming a group of parallel conductor lines on one surface of a flexible substrate; exposing each end of the group of parallel conductor lines out of the substrate to form groups of metal conductor projection rows; preparing two of the substrates made in such way and stacking them in directions opposite to each other; joining the groups of the metal conductor projection rows facing each other; and then rolling the substrates into a cylindrical shape (for example, see Japanese Patent Laid-Open No. 55-127852).

Electric motors are required to be small and lightweight. However, the stator, which is a main component of the electric motor, is generally configured to have coils wound at high density, and such a configuration of the stator causes increase in the weight of the electric motor. Therefore, it is effective to reduce the weight of the electric motor by forming a coil pattern on a relatively lightweight flexible circuit board to configure the stator.

However, the configuration of a stator with conventional flexible circuit boards needs a step of electrically connecting coils formed on the flexible circuit boards, a step of stacking a plurality of flexible circuit boards having coil patterns formed thereon, and the like. This disadvantageously complicates the manufacturing process and complicates the structure of the stator.

The present application has been made in view of this background, and an object of the present application is to provide a flexible circuit board, a method of manufacturing the same, and an electric motor configured with the flexible circuit board, which enable weight reduction of the electric motor and simplification of manufacturing the electric motor.

SUMMARY OF THE INVENTION

A first aspect for achieving the object is a flexible circuit board including: a plurality of first wirings and third wirings alternately formed, on a first surface of a strip-shaped insulating sheet having flexibility, in parallel in a longitudinal direction of the insulating sheet; a plurality of second wirings and fourth wirings alternately formed, on a second surface of the insulating sheet, in parallel in the longitudinal direction of the insulating sheet, the second wirings and fourth wirings being spaced apart from the first wirings and the third wirings; wiring connecting portions: connecting ends of the adjacent first wirings and second wirings through the insulating sheet and thereby forming a first continuous wiring in which a plurality of the first wirings and the second wirings are alternately connected through the insulating sheet; and connecting ends of the adjacent third wirings and fourth wirings through the insulating sheet and thereby forming a second continuous wiring in which a plurality of the third wirings and the fourth wirings are alternately connected through the insulating sheet; an external terminal connected to a first continuous wiring first end that is one end of the first continuous wiring; and a reversal connection portion connecting a first continuous wiring second end with a second continuous wiring second end, the first continuous wiring second end being another end of the first continuous wiring, the second continuous wiring second end being an end of the second continuous wiring on a side of the first continuous wiring second end.

The flexible circuit board may be configured so that the first continuous wiring and the second continuous wiring have a chain-like intersecting shape with the insulating sheet interposed therebetween, and an intersection of the first continuous wiring and the second continuous wiring forms an electromagnetic coil.

The flexible circuit board may be configured so that the wiring connecting portions connect terminals of the adjacent first wirings and second wirings and terminals of the adjacent third wirings and fourth wirings through via holes penetrating the insulating sheet.

The flexible circuit board may be configured so that the external terminal and the reversal connection portion are arranged on a side of an identical long side of the insulating sheet.

A second aspect for achieving the above object is an electric motor having a plurality of phases, the electric motor including: a stator configured by bending a flexible circuit board into a cylindrical shape, the flexible circuit board having electromagnetic coil wirings; and a rotor arranged outside an outer circumference of the stator or inside an inner circumference of the stator, wherein, for each of a plurality of the phases, the flexible circuit board includes: a plurality of first wirings and third wirings alternately formed, on a first surface of a strip-shaped insulating sheet having flexibility, in parallel in a longitudinal direction of the insulating sheet; a plurality of second wirings and fourth wirings alternately formed, on a second surface of the insulating sheet, in parallel in the longitudinal direction of the insulating sheet, the second wirings and fourth wirings being spaced apart from the first wirings and the third wirings; wiring connecting portions: connecting ends of the adjacent first wirings and second wirings through the insulating sheet and thereby forming a first continuous wiring in which a plurality of the first wirings and the second wirings are alternately connected through the insulating sheet; and connecting ends of the adjacent third wirings and fourth wirings through the insulating sheet and thereby forming a second continuous wiring in which a plurality of the third wirings and the fourth wirings are alternately connected through the insulating sheet; an external terminal connected to a first continuous wiring first end that is one end of the first continuous wiring; and a reversal connection portion connecting a first continuous wiring second end with a second continuous wiring second end, the first continuous wiring second end being another end of the first continuous wiring, the second continuous wiring second end being an end of the second continuous wiring on a side of the first continuous wiring second end, and the first continuous wiring and the second continuous wiring have a chain-like intersecting shape with the insulating sheet interposed therebetween, and an intersection of the first continuous wiring and the second continuous wiring forms an electromagnetic coil of a slot of the stator.

A third aspect for achieving the above object is a method of manufacturing a flexible circuit board including: a step of forming a plurality of first wirings and third wirings alternately formed, on a first surface of an insulating sheet having flexibility, in parallel in a predetermined direction; a step of forming a plurality of second wirings and fourth wirings alternately formed, on a second surface of the insulating sheet, in parallel in the predetermined direction, the second wirings and fourth wirings being spaced apart from the first wirings and the third wirings; a step of: connecting ends of the adjacent first wirings and second wirings through the insulating sheet and thereby forming a first continuous wiring in which a plurality of the first wirings and the second wirings are alternately connected through the insulating sheet; and connecting ends of the adjacent third wirings and fourth wirings through the insulating sheet and thereby forming a second continuous wiring in which a plurality of the third wirings and the fourth wirings are alternately connected through the insulating sheet; a step of forming an external terminal connected to a first continuous wiring first end that is one end of the first continuous wiring; and a step of forming a reversal connection portion connecting a first continuous wiring second end with a second continuous wiring second end, the first continuous wiring second end being another end of the first continuous wiring, the second continuous wiring second end being an end of the second continuous wiring on a side of the first continuous wiring second end.

Advantageous Effects of Invention

According to the above flexible circuit board, it is possible to reduce the weight of the electric motor and simplify the manufacturing process thereof.

BRIEF DESCRIPTION OF THE DRAWINGS

FIG. 4 is an explanatory diagram of a manufacturing process of a flexible circuit board.

DETAILED DESCRIPTION OF THE PREFERRED EMBODIMENTS

1. Configuration of Flexible Circuit Board

Figure 1:
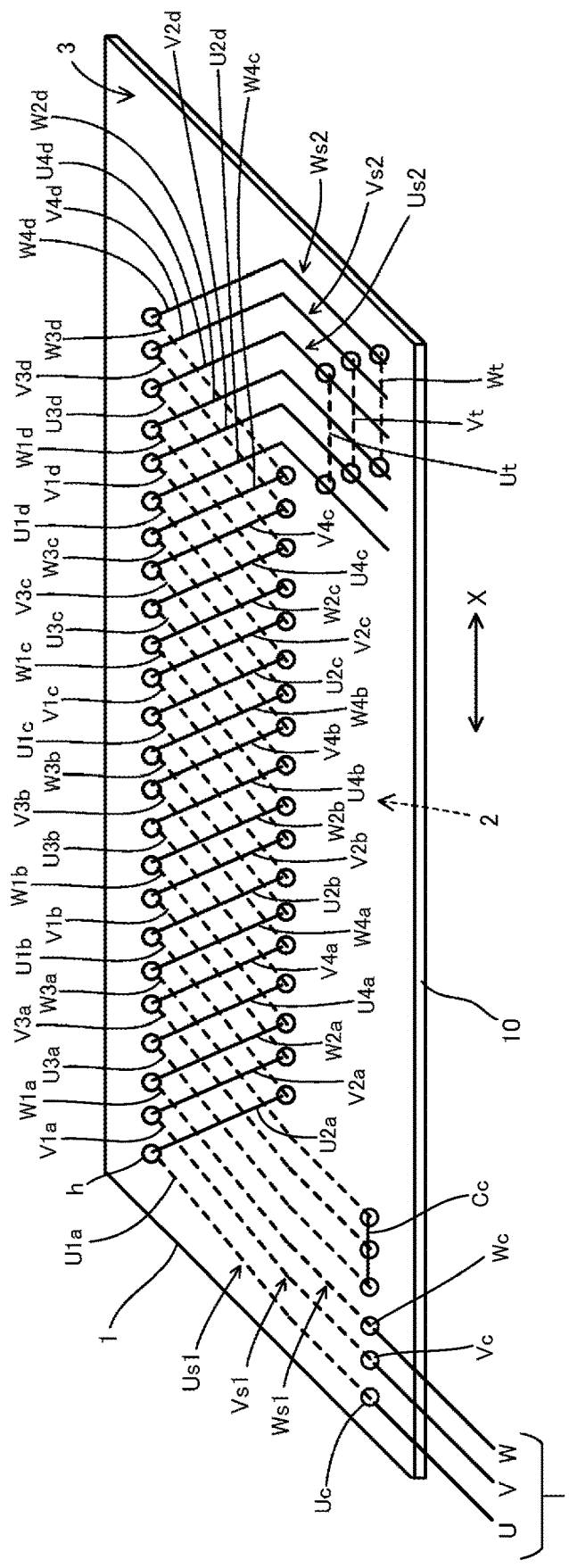
FIG. 1 is an explanatory diagram showing a configuration of a flexible circuit board that configures a stator of an electric motor.

A configuration of a flexible circuit board 1 of the present embodiment will be described with reference to FIGS. 1 and 2. The flexible circuit board 1 is used as a component of a stator 70 of a three-phase brushless motor 50 (corresponding to an electric motor of the present disclosure) shown in FIG. 2. As shown in FIG. 1, the flexible circuit board 1 has wirings of electromagnetic coils configuring slots for three phases of U, V, and W. The wirings are formed on each surface (a first surface 2 and a second surface 3) of an insulating sheet 10 having flexibility.

Figure 2:
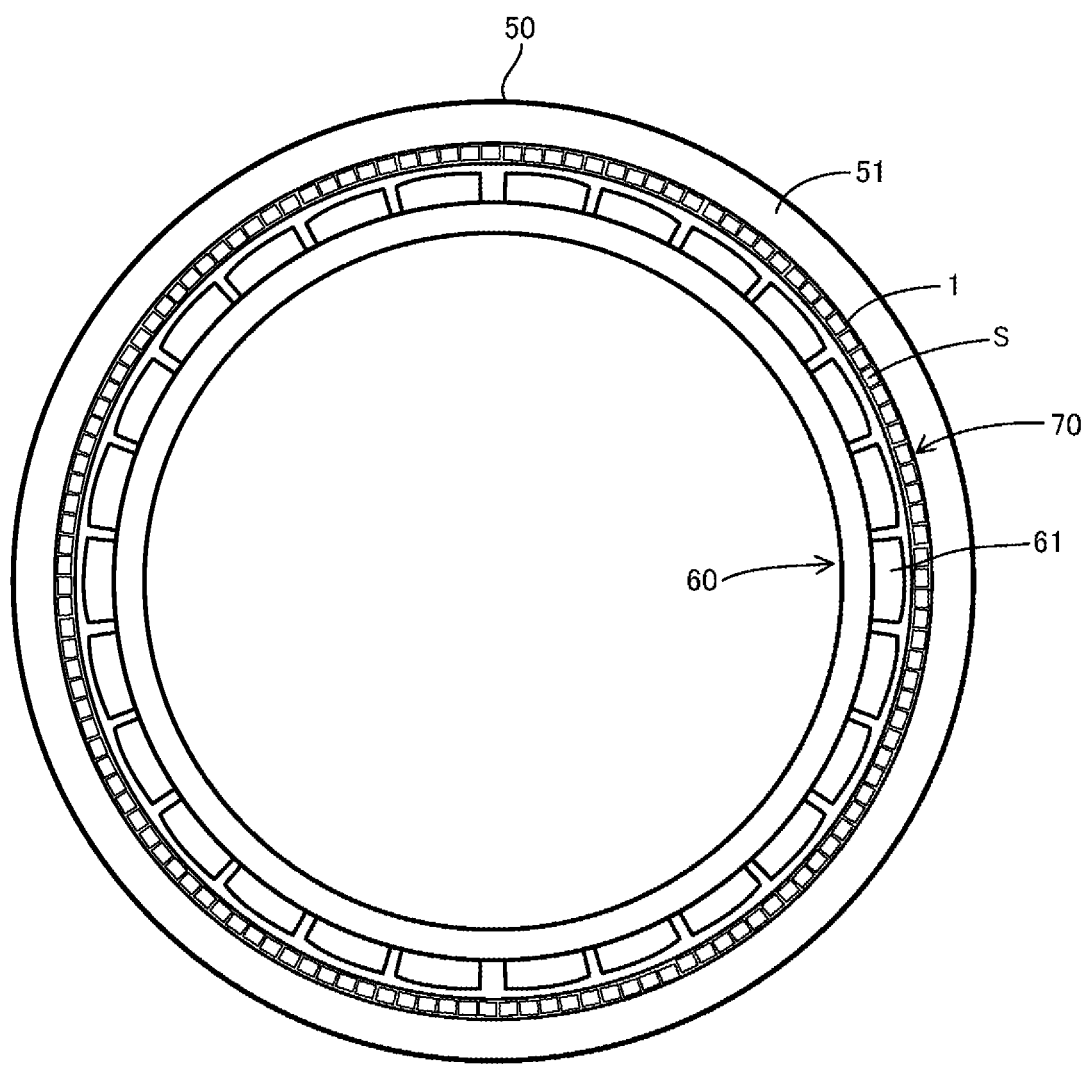
FIG. 2 is an explanatory diagram of an electric motor including a stator with a flexible circuit board.

As shown in FIG. 2, the stator 70 is formed by bending the flexible circuit board 1 into a cylindrical shape outside the outer circumference of a rotor 60 to which permanent magnets 61 are bonded or embedded. Use of the stator 70 makes it possible to reduce the weight of the stator as compared with general stators in which conducting wires are wound to form coils. Note that there may be a configuration such that the stator 70 is arranged on the inner circumferential side of the rotor 60.

The flexible circuit board 1 makes it possible to easily increase the arrangement density of slots S of the stator 70. The increased arrangement density of the slots S can shorten the magnetic path of the magnetic force generated in the electromagnetic coil of each slot S to thin a metal portion 51 of the stator 70. Thereby, the weight per volume of the brushless motor 50 can be reduced.

With reference to FIG. 1, on a first surface 2 of the insulating sheet 10, a plurality of first wirings U1 (U1$a$, U1$b$, U1$c$, U1$d$) for configuring a U-phase electromagnetic coil are formed continuously in parallel in an X direction that is a longitudinal direction of the insulating sheet 10. Further, on a second surface 3 of the insulating sheet 10, a plurality of second wirings U2 (U2$a$, U2$b$, U2$c$, U2$d$) for configuring a U-phase electromagnetic coil are formed in parallel in the X direction of the insulating sheet 10.

Ends of the adjacent first wirings U1 and second wirings U2 are electrically continuous through the insulating sheet 10 with via holes h. This alternately connects the first wirings U1 and the second wirings U2 through the insulating sheet 10 in the following order: the first wiring U1$a$→the second wiring U2$a$→the first wiring U1$b$→the second wiring U2$b$→the first wiring U1$c$→the second wiring U2$c$→the first wiring U1d→the second wiring U2d. The connected wirings U1 and U2 form a first continuous wiring Us1.

On the first surface 2 of the insulating sheet 10, a plurality of third wirings U3 (U3a, U3b, U3c, U3d) for configuring a U-phase electromagnetic coil are formed continuously in parallel in the X direction of the insulating sheet 10. Further, on the second surface 3 of the insulating sheet 10, a plurality of fourth wirings U4 (U4a, U4b, U4c, U4d) for configuring a U-phase electromagnetic coil are formed continuously in parallel in the X direction of the insulating sheet 10.

Ends of the adjacent third wirings U3 and fourth wirings U4 are electrically continuous through the insulating sheet 10 with the via holes h. This alternately connects the third wirings U3 and the fourth wirings U4 through the insulating sheet 10 in the following order: the third wiring U3a→the fourth wiring U4a→the third wiring U3b→the fourth wiring U4b→the third wiring U3c→the fourth wiring U4c→the third wiring U3d→the fourth wiring U4d. The connected wirings U3 and U4 form a second continuous wiring Us2.

One end of the first continuous wiring Us1 (left end in FIG. 1, corresponding to a first continuous wiring first end in the present disclosure) is connected to a U-phase external terminal Uc. The other end of the first continuous wiring Us1 (right end in FIG. 1, corresponding to a first continuous wiring second end of the present disclosure) is connected, by a reversal portion Ut, to one end of the second continuous wiring Us2 (right end in FIG. 1, corresponding to a second continuous wiring second end of the present disclosure) to be electrically continuous together. The other end of the second continuous wiring (left end in FIG. 1) is connected to a common connection portion Cc. Such connection forms a circuit that is electrically continuous as follows: the external terminal Uc→the first continuous wiring Us1→the reversal portion Ut→the second continuous wiring Us2→the common connection portion Cc.

Similarly, for the V phase, a first continuous wiring Vs1 is formed by alternately connecting a plurality of first wirings V1 (V1a, V1b, V1c, V1d) and second wirings V2 (V2a, V2b, V2c, V2d) through the insulating sheet 10. Also, a second continuous wiring Vs2 is formed by alternately connecting a plurality of third wirings V3 (V3a, V3b, V3c, V3d) and fourth wirings V4 (V4a, V4b, V4c, V4d) through the insulating sheet 10. This forms a circuit that is electrically continuous as follows: an external terminal Vc→the first continuous wiring Vs1→a reversal portion Vt→the second continuous wiring Vs2→the common connection portion Cc.

Similarly, for the W phase, a first continuous wiring Ws1 is formed by alternately connecting a plurality of first wirings W1 (W1a, W1b, W1c, W1d) and second wirings W2 (W2a, W2b, W2c, W2d) through the insulating sheet 10. Also, a second continuous wiring Ws2 is formed by alternately connecting a plurality of the third wirings W3 (W3a, W3b, W3c, W3d) and the fourth wirings W4 (W4a, W4b, W4c, W4d) through the insulating sheet 10. This forms a circuit that is electrically continuous as follows: an external terminal Wc→the first continuous wiring Ws1→a reversal portion Wt→the second continuous wiring Ws2→the common connection portion Cc.

In this way, on the flexible circuit board 1, chain-shaped intersecting circuits are formed that configure a plurality of slots of electromagnetic coils for three phases of U, V, and W. Here, supply of drive power from the motor drive circuit to the external terminals Uc, Vc, and Wc can generate a rotating magnetic field by the magnetic force generated in each slot.

Unlike the stator of a general brushless motor, this can eliminate need for a step of forming slots each with an electromagnetic coil of a wound conducting wires and a step of connecting the coils to be electrically continuous, resulting in a simplified manufacturing process of the stator. In addition, this makes it possible to avoid defects in brushless motors due to defects in a step of connecting the electromagnetic coils of each slot, etc., to improve the manufacturing quality of the brushless motor. Note that FIG. 1 shows an example in which each four of first wirings U1, V1, W1 and each four of second wirings U2, V2, W2 are formed, but it is possible to increase or decrease the number of the first wirings U1, V1, W1 and the number of the second wirings U2, V2, W2 and thereby set any number of slots of the stator.

2. Configuration with Double Wiring

Figure 3:
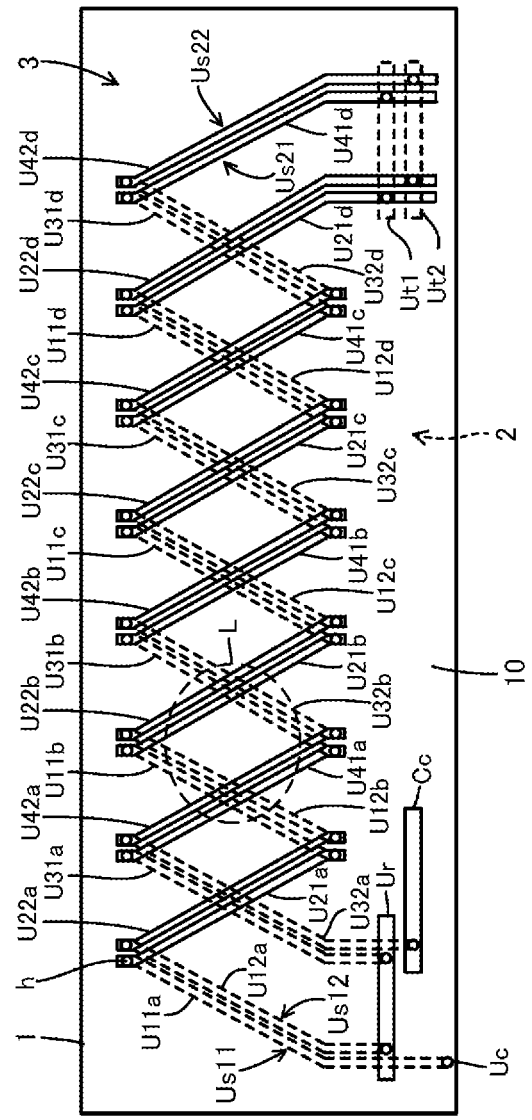
FIG. 3 is an explanatory diagram showing a configuration of a flexible circuit board in which wirings forming electromagnetic coils are doubled.

The following describes a configuration example in which the first continuous wiring Us1 and the second continuous wiring Us2 corresponding to the U phase are doubled, with reference to FIG. 3. In FIG. 3, for convenience of explanation, only the U-phase wiring is shown, but the same applies to the V-phase and W-phase wirings.

In the example of FIG. 3, two first continuous wirings Us1 (Us11, Us12) and two second continuous wirings Us2 (Us21, Us22) are formed. The first continuous wiring Us11 is formed by alternately connecting, through the via holes h, a plurality of the first wirings U11 (U11a, U11b, U11c, U11d) formed on the first surface 2 of the insulating sheet 10 and a plurality of the second wirings U21 (U21a, U21b, U21c, U21d) formed on the second surface 3 of the insulating sheet 10.

The first second continuous wiring Us21 is formed by the via holes h alternately connecting, through the insulating sheet 10, a plurality of the third wirings U31 (U31a, U31b, U31c, U31d) formed on the second surface 3 of the insulating sheet 10 and a plurality of the fourth wirings U41 (U41a, U41b, U41c, U41d) formed on the first surface 2 of the insulating sheet 10.

The second first continuous wiring Us12 is formed by the via holes h alternately connecting, through the insulating sheet 10, a plurality of the first wirings U12 (U12a, U12b, U12c, U12d) formed on the first surface 2 of the insulating sheet 10 and a plurality of the second wirings U22 (U22a, U22b, U22c, U22d) formed on the second surface 3 of the insulating sheet 10.

The second continuous wiring Us22 is formed by the via holes h alternately connecting, through the insulating sheet 10, a plurality of the third wirings U32 (U32a, U32b, U32c, U32d) formed on the second surface 3 of the insulating sheet 10 and the fourth wirings U42 (U42a, U42b, U42c, U42d) formed on the first surface 2 of the insulating sheet 10.

One end of the first continuous wiring Us11 (left end in FIG. 3) is connected to the external terminal Uc. The other end of the first continuous wiring Us11 (right end in FIG. 3) and one end of the second continuous wiring Us21 (right end in FIG. 3) are connected at a reversal portion Ut1. One end of the first continuous wiring Us12 (left end in FIG. 3) is connected to the other end of the second continuous wiring Us21 (left end in FIG. 3) at a relay portion Ur. The other end of the first continuous wiring Us12 (right end in FIG. 3) and one end of the second continuous wiring Us22 (right end in FIG. 3) are connected by a reversal portion Ut2 to be electrically continuous. The other end of the second continuous wiring Us22 (left end in FIG. 3) is connected to the common connection portion Cc.

This forms a circuit that is electrically continuous as follows: the external terminal Uc→the first continuous wiring Us11→the reversal portion Ut1→the second continuous wiring Us21→the relay portion Ur→the first continuous wiring Us12→the reversal portion Ut2→the second continuous wiring Us22→the common connection portion Cc. Then, as shown by L in FIG. 3, an electromagnetic coil is formed by double wiring of an intersection between the first continuous wiring Us11 and the second continuous wiring Us21 and an intersection between the first continuous wiring Us12 and the second continuous wiring Us22.

The double wiring in this manner can increase the magnetic force generated in the electromagnetic coils of the slots when the stator is configured with the flexible circuit board 1. Note that the wiring may be three times or more.

3. Manufacture of Flexible Circuit Board

A manufacturing process of the flexible circuit board 1 will be described with reference to FIG. 4. The manufacturing process includes steps of: (1) production of CCLs (cupper clad laminations, copper foils), (2) opening of via holes, (3) plating of vias, (4) bonding of dry films, (5) exposure, (6) development, (7) etching, (8) removal of dry films, (9) bonding & curing of CLs (cover lays), (10) surface treatment, (11) punching of outline, and (12) inspection.

(1) Production of CCLs: Copper foils 12a, 12b are bonded to each surface of the insulating sheet 10 (corresponding to the first surface 2 and the second surface 3 in FIGS. 1 and 3) with an adhesive 11a and 11b.

(2) Opening of via holes: V1a holes 13a, 13b are opened to electrically connect the copper foils 12a and 12b through the insulating sheet 10.

(3) Plating of vias: The via holes 13a, 13b and the copper foils 12a, 12b are plated to electrically connect the copper foils 12a, 12b on each surface of the insulating sheet 10.

(4) Bonding of dry films: Dry films 15a, 15b each made by processing photosensitive resin into a film are respectively bonded to the first surface 2 side and the second surface 3 side.

(5) Exposure: Negative films 16a, 16b on which circuit patterns are drawn are placed on dry films 15a, 15b, which are then irradiated with ultraviolet (UV) to harden circuit portions. Portions other than the circuit portions are 17a to 17f. In the example of FIG. 1, the first wirings U1, V1, W1 and the fourth wirings U4, V4, W4 are drawn on the negative film 16b on the first surface 2 side, and the second wirings U2, V2, W2 and the third wirings U3, V3, W3 are drawn on the negative film 16a on the second surface 3 side.

(6) Development: The cured portions 18a to 18c of the dry films 15a, 15b corresponding to the portions other than the circuit pattern are dissolved to be removed.

(7) Etching: Only the portions 19a to 19f from which the dry films 15a, 15b of the copper foils 12a, 12b and the plating 14a, 14b, 14c have been removed are removed by dry etching with a reactive gas, plasma, or the like.

(8) Removal of dry films: The dry films 15a, 15b are removed with a chemical solution.

(9) Bonding & curing of CLs (cover lays): In order to form an insulating layer, the cover lays 21a to 21d are pressure-bonded from 20a to 20d on the first surface 2 side and the second surface 3 side.

(10) Surface treatment: The exposed portions of the copper foils 12a, 12b are subjected to gold plating 22a to 22f (rust prevention).

(11) Punching of outline: The flexible circuit board 1 shown in FIG. 1 is completed by punching the outline out of the sheet.

(12) Inspection: The flexible circuit board 1 is inspected for electrical continuity, disconnection, short circuit, and the like. In this case, the flexible circuit board 1 alone can be inspected before the flexible circuit board 1 is installed into the brushless motor 50. Therefore, unlike general brushless motors in which a stator is assembled by installing electromagnetic coils of wound conducting wires, it is possible to avoid need to replace or repair the stator due to discovery of a defective wiring of the stator in the inspection after assembling the brushless motor.

4. Other Embodiments

In the above embodiment, an example is shown in which the flexible circuit board 1 of the present disclosure is used for a component of the stator of the brushless motor 50. However, the flexible circuit board 1 can also be used to configure a stator for other types of electric motors that configures a stator with electromagnetic coils.

It is also possible to apply the flexible circuit board of the present disclosure to uses other than the stator of the electric motor. For example, the flexible circuit board of the present disclosure may be used for purposes of noise removal such as choke coils instead of electromagnetic coils. Alternatively, like the reversal portions Ut, Vt, Wt shown in FIG. 1, formation of a reversal portion for reversing the conducting directions of the wirings makes it possible to apply the flexible circuit board 1 to uses for defining the direction of current flow in the circuit board.

In the above embodiment, an example is described in which the flexible circuit board 1 is manufactured by dry etching as shown in FIG. 4, but it may be manufactured by wet etching. Alternatively, the flexible circuit board 1 may be manufactured by other manufacturing methods such as an additive method in which copper is deposited only on the wiring portion by electroless plating instead of the subtractive method with etching.

5. Configurations Supported by Above Embodiments

The above embodiments are specific examples of the following configurations.

(Configuration 1) a flexible circuit board including: a plurality of first wirings and third wirings alternately formed, on a first surface of a strip-shaped insulating sheet having flexibility, in parallel in a longitudinal direction of the insulating sheet; a plurality of second wirings and fourth wirings alternately formed, on a second surface of the insulating sheet, in parallel in the longitudinal direction of the insulating sheet, the second wirings and fourth wirings being spaced apart from the first wirings and the third wirings; wiring connecting portions: connecting ends of the adjacent first wirings and second wirings through the insulating sheet and thereby forming a first continuous wiring in which a plurality of the first wirings and the second wirings are alternately connected through the insulating sheet; and connecting ends of the adjacent third wirings and fourth wirings through the insulating sheet and thereby forming a second continuous wiring in which a plurality of the third wirings and the fourth wirings are alternately connected through the insulating sheet; an external terminal connected to a first continuous wiring first end that is one end of the first continuous wiring; and a reversal connection portion connecting a first continuous wiring second end with a second continuous wiring second end, the first continuous wiring second end being another end of the first continuous wiring, the second continuous wiring second end being an end of the second continuous wiring on a side of the first continuous wiring second end.

According to the flexible circuit board of Configuration 1, the connection of the first wiring, the second wiring, the third wiring, and the fourth wiring formed on the insulating sheet has been completed by the wiring connecting portions. In addition, a reversal connection portion, which reverses the direction of current flow between the first continuous wiring and the second continuous wiring, and an external terminal, which causes current to flow through the first continuous wiring, have already been formed. Therefore, the manufacturing process can be simplified by eliminating a step of making additional connections, and the weight of the circuit board can be reduced with an increased density of the wiring formed on the insulating sheet. Therefore, the configuration of the electric motor with a flexible circuit board of Configuration 1 makes it possible to reduce the weight of the electric motor and simplify the manufacturing process thereof.

(Configuration 2) The flexible circuit board according to Configuration 1, wherein the first continuous wiring and the second continuous wiring have a chain-like intersecting shape with the insulating sheet interposed therebetween, and an intersection of the first continuous wiring and the second continuous wiring forms an electromagnetic coil.

According to the flexible circuit board of Configuration 2, the flexible circuit board can function as a stator with increased magnetic force due to the magnetic field generated with the current flowing through the first continuous wiring and the second continuous wiring at the intersections.

(Configuration 3) The flexible circuit board according to Configuration 1 or 2, wherein the wiring connecting portions connect terminals of the adjacent first wirings and second wirings and terminals of the adjacent third wirings and fourth wirings through via holes penetrating the insulating sheet.

According to the flexible circuit board of Configuration 3, connection is made by the via holes. This eliminates need for separately connecting the terminals of the first wiring and the second wiring and the terminals of the third wiring and the fourth wiring, thereby simplifying the manufacture of the flexible circuit board.

(Configuration 4) The flexible circuit board according to any one configuration of Configurations 1 to 3, wherein the external terminal and the reversal connection portion are arranged on a side of an identical long side of the insulating sheet.

According to the flexible circuit board of Configuration 4, it is possible to increase the efficiency of arranging the external terminals and the reversal connection portion to reduce the size of the flexible circuit board.

(Configuration 5) An electric motor having a plurality of phases, the electric motor including: a stator configured by bending a flexible circuit board into a cylindrical shape, the flexible circuit board having electromagnetic coil wirings; and a rotor arranged outside an outer circumference of the stator or inside an inner circumference of the stator, wherein, for each of a plurality of the phases, the flexible circuit board includes: a plurality of first wirings and third wirings alternately formed, on a first surface of a strip-shaped insulating sheet having flexibility, in parallel in a longitudinal direction of the insulating sheet; a plurality of second wirings and fourth wirings alternately formed, on a second surface of the insulating sheet, in parallel in the longitudinal direction of the insulating sheet, the second wirings and fourth wirings being spaced apart from the first wirings and the third wirings; wiring connecting portions: connecting ends of the adjacent first wirings and second wirings through the insulating sheet and thereby forming a first continuous wiring in which a plurality of the first wirings and the second wirings are alternately connected through the insulating sheet; and connecting ends of the adjacent third wirings and fourth wirings through the insulating sheet and thereby forming a second continuous wiring in which a plurality of the third wirings and the fourth wirings are alternately connected through the insulating sheet; an external terminal connected to a first continuous wiring first end that is one end of the first continuous wiring; and a reversal connection portion connecting a first continuous wiring second end with a second continuous wiring second end, the first continuous wiring second end being another end of the first continuous wiring, the second continuous wiring second end being an end of the second continuous wiring on a side of the first continuous wiring second end, and the first continuous wiring and the second continuous wiring have a chain-like intersecting shape with the insulating sheet interposed therebetween, and an intersection of the first continuous wiring and the second continuous wiring forms an electromagnetic coil of a slot of the stator.

According to the electric motor of Configuration 5, the circuit wirings of the stator is formed on the flexible circuit board. This can eliminate need for a step of configuring the stator by installing coils of wound conducting wires and inspection of the installed stator, thereby simplifying the manufacturing process of the electric motor. In addition, the weight of the electric motor can be reduced by configuring the stator with the flexible circuit board.

(Configuration 6) A method of manufacturing a flexible circuit board including: a step of forming a plurality of first wirings and third wirings alternately formed, on a first surface of an insulating sheet having flexibility, in parallel in a predetermined direction; a step of forming a plurality of second wirings and fourth wirings alternately formed, on a second surface of the insulating sheet, in parallel in the predetermined direction, the second wirings and fourth wirings being spaced apart from the first wirings and the third wirings; a step of: connecting ends of the adjacent first wirings and second wirings through the insulating sheet and thereby forming a first continuous wiring in which a plurality of the first wirings and the second wirings are alternately connected through the insulating sheet; and connecting ends of the adjacent third wirings and fourth wirings through the insulating sheet and thereby forming a second continuous wiring in which a plurality of the third wirings and the fourth wirings are alternately connected through the insulating sheet; a step of forming an external terminal connected to a first continuous wiring first end that is one end of the first continuous wiring; and a step of forming a reversal connection portion connecting a first continuous wiring second end with a second continuous wiring second end, the first continuous wiring second end being another end of the first continuous wiring, the second continuous wiring second end being an end of the second continuous wiring on a side of the first continuous wiring second end.

By implementing the method of manufacturing of Configuration 6, the flexible circuit board of Configuration 1 can be manufactured.

REFERENCE SIGNS LIST

1: flexible circuit board, 2: first surface of insulating sheet, 3: second surface of insulating sheet, 10: insulating sheet, U1 (U1a to U1d): first wirings of U phase, V1 (V1a to V1d): first wirings of V phase, W1 (W1a to W1d): first wirings of W phase, U2 (U2a to U2d): second wirings of U phase, V2 (V2a to V2d): second wirings of V phase, W2 (W2a to W2d): second wirings of W phase, U3 (U3a to U3d): third wirings of U phase, V3 (V3a to V3d): third wirings of V phase, W3 (W3a to W3d): third wirings of W phase, U4 (U4a to U4d): fourth wirings of U phase, Us1: first continuous wiring of U phase, Vs1: first continuous wiring of V phase, Ws1: first continuous wiring of W phase, Us2: second continuous wiring of U phase, Vs2: second continuous wiring of V phase, Ws2: second continuous wiring of W phase, Ut: reversal portion of U phase, Vt: reversal portion of V phase, Wt: reversal portion of W phase, Uc: external terminal of U phase, Vc: external terminal of V phase, Wc: external terminal of W phase, Cc: common connection portion, U11 (U11a to U11d), U12 (U12a to U12d): double first wirings of U phase, U21 (U21a to U21d), U22 (U22a to U22d): double second wirings of U phase, Us11, Us12: double first continuous wirings of U phase, Us21, Us22: double second continuous wirings of U-phase, Ut1, Ut2: double reversal portions of U phase, 50: brushless motor (electric motor), 51: metal portion, 60: rotor, 61: permanent magnet, 70: stator.

What is claimed is:

1. A flexible circuit board comprising:
a plurality of first wirings and third wirings alternately formed, on a first surface of a strip-shaped insulating sheet having flexibility, in parallel in a longitudinal direction of the insulating sheet;
a plurality of second wirings and fourth wirings alternately formed, on a second surface of the insulating sheet, in parallel in the longitudinal direction of the insulating sheet, the second wirings and fourth wirings being spaced apart from the first wirings and the third wirings;
wiring connecting portions: connecting ends of the adjacent first wirings and second wirings through the insulating sheet and thereby forming a first continuous wiring in which a plurality of the first wirings and the second wirings are alternately connected through the insulating sheet; and connecting ends of the adjacent third wirings and fourth wirings through the insulating sheet and thereby forming a second continuous wiring in which a plurality of the third wirings and the fourth wirings are alternately connected through the insulating sheet;
an external terminal connected to a first continuous wiring first end that is one end of the first continuous wiring; and
a reversal connection portion connecting a first continuous wiring second end with a second continuous wiring second end, the first continuous wiring second end being another end of the first continuous wiring, the second continuous wiring second end being an end of the second continuous wiring on a side of the first continuous wiring second end.

2. The flexible circuit board according to claim 1, wherein the first continuous wiring and the second continuous wiring have a chain-like intersecting shape with the insulating sheet interposed therebetween, and an intersection of the first continuous wiring and the second continuous wiring forms an electromagnetic coil.

3. The flexible circuit board according to claim 1, wherein the wiring connecting portions connect terminals of the adjacent first wirings and second wirings and terminals of the adjacent third wirings and fourth wirings through via holes penetrating the insulating sheet.

4. The flexible circuit board according to claim 1, wherein the external terminal and the reversal connection portion are arranged on a side of an identical long side of the insulating sheet.

5. An electric motor having a plurality of phases, the electric motor comprising:
a stator configured by bending a flexible circuit board into a cylindrical shape, the flexible circuit board having electromagnetic coil wirings; and
a rotor arranged outside an outer circumference of the stator or inside an inner circumference of the stator,
wherein, for each of a plurality of the phases, the flexible circuit board includes:
a plurality of first wirings and third wirings alternately formed, on a first surface of a strip-shaped insulating sheet having flexibility, in parallel in a longitudinal direction of the insulating sheet;
a plurality of second wirings and fourth wirings alternately formed, on a second surface of the insulating sheet, in parallel in the longitudinal direction of the insulating sheet, the second wirings and fourth wirings being spaced apart from the first wirings and the third wirings;
wiring connecting portions: connecting ends of the adjacent first wirings and second wirings through the insulating sheet and thereby forming a first continuous wiring in which a plurality of the first wirings and the second wirings are alternately connected through the insulating sheet; and connecting ends of the adjacent third wirings and fourth wirings through the insulating sheet and thereby forming a second continuous wiring in which a plurality of the third wirings and the fourth wirings are alternately connected through the insulating sheet;
an external terminal connected to a first continuous wiring first end that is one end of the first continuous wiring; and
a reversal connection portion connecting a first continuous wiring second end with a second continuous wiring second end, the first continuous wiring second end being another end of the first continuous wiring, the second continuous wiring second end being an end of the second continuous wiring on a side of the first continuous wiring second end, and
the first continuous wiring and the second continuous wiring have a chain-like intersecting shape with the insulating sheet interposed therebetween, and an intersection of the first continuous wiring and the second continuous wiring forms an electromagnetic coil of a slot of the stator.

6. A method of manufacturing a flexible circuit board comprising:
a step of forming a plurality of first wirings and third wirings alternately formed, on a first surface of an insulating sheet having flexibility, in parallel in a predetermined direction;
a step of forming a plurality of second wirings and fourth wirings alternately formed, on a second surface of the insulating sheet, in parallel in the predetermined direction, the second wirings and fourth wirings being spaced apart from the first wirings and the third wirings;

a step of: connecting ends of the adjacent first wirings and second wirings through the insulating sheet and thereby forming a first continuous wiring in which a plurality of the first wirings and the second wirings are alternately connected through the insulating sheet; and connecting ends of the adjacent third wirings and fourth wirings through the insulating sheet and thereby forming a second continuous wiring in which a plurality of the third wirings and the fourth wirings are alternately connected through the insulating sheet;

a step of forming an external terminal connected to a first continuous wiring first end that is one end of the first continuous wiring; and a step of forming a reversal connection portion connecting a first continuous wiring second end with a second continuous wiring second end, the first continuous wiring second end being another end of the first continuous wiring, the second continuous wiring second end being an end of the second continuous wiring on a side of the first continuous wiring second end.

* * * * *